United States Patent
Kinsely et al.

(10) Patent No.: US 7,200,062 B2
(45) Date of Patent: Apr. 3, 2007

(54) METHOD AND SYSTEM FOR REDUCING THE PEAK CURRENT IN REFRESHING DYNAMIC RANDOM ACCESS MEMORY DEVICES

(75) Inventors: Thomas H. Kinsely, Boise, ID (US); Jeffery W. Janzen, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 193 days.

(21) Appl. No.: 10/931,564

(22) Filed: Aug. 31, 2004

(65) Prior Publication Data

US 2006/0044909 A1 Mar. 2, 2006

(51) Int. Cl.
*G11C 7/00* (2006.01)

(52) U.S. Cl. ............... 365/222; 365/233; 365/194; 365/230.03

(58) Field of Classification Search ......... 365/222.233, 365/194, 230.03
See application file for complete search history.

(56) References Cited

U.S. PATENT DOCUMENTS

| | | | |
|---|---|---|---|
| 4,222,112 A | 9/1980 | Clemons et al. ............ 365/189 |
| 4,887,240 A | 12/1989 | Garverick et al. .......... 361/222 |
| 4,912,678 A | 3/1990 | Mashiko ..................... 365/222 |
| 5,761,703 A | 6/1998 | Bolyn ......................... 711/106 |
| 5,955,905 A * | 9/1999 | Idei et al. ................... 327/160 |
| 6,842,864 B1 * | 1/2005 | Barth et al. ................. 713/401 |
| 7,043,599 B1 * | 5/2006 | Ware et al. ................. 711/106 |
| 2003/0227801 A1 | 12/2003 | Battaglia .................... 365/200 |

* cited by examiner

*Primary Examiner*—Viet Q. Nguyen
(74) *Attorney, Agent, or Firm*—Dorsey & Whitney, LLP

(57) ABSTRACT

A dynamic random access memory device includes a mode register that is programmed with a delay value. In some embodiments, an offset code is also stored in the memory device. The memory device uses the delay value, which may be added to or multiplied by the offset code, to delay the initiation of a received auto-refresh or self-refresh command. A large number of dynamic random access memory devices in a system may be provided with different delay values and possibly offset codes so that the memory device do not all perform refreshes simultaneously in response to an auto-refresh or self-refresh command issued to all of the memory devices simultaneously. As a result, the peak current drawn by the memory devices resulting from the auto-refresh command or self-refresh command is maintained at a relatively low value.

33 Claims, 8 Drawing Sheets

METHOD AND SYSTEM FOR REDUCING THE PEAK CURRENT IN REFRESHING DYNAMIC RANDOM ACCESS MEMORY DEVICES

FIELD OF THE INVENTION

The present invention relates to memory systems, and more particularly, to systems and methods for reducing the peak current demand of dynamic random access memory devices when memory cells are to be refreshed.

BACKGROUND OF THE INVENTION

A variety of memory devices are in common use in a wide range of electronic devices. A common variety of memory devices are dynamic random access memory ("DRAM") devices, which are used in a variety of applications, such as for system memory in computer systems. As is well known in the art, a DRAM device includes a large number of DRAM memory cells that are essentially individual capacitors that store one of two voltage levels corresponding to respective binary values of a data bit. As also well known in the art, capacitors, including those used as DRAM memory cells, leak charge and therefore cannot retain a voltage level indefinitely. For this reason, it is necessary to periodically restore the voltage initially stored in a DRAM memory cell capacitor, which is accomplished using a process known as "refresh."

Typical DRAM memory cells and associated circuitry are shown in FIG. 1. The DRAM memory cells 14 (only eight are shown in FIG. 1) each include two capacitor plates 16, 18. One of the plates 16 is known as a cell plate that is generally common to all of the memory cells 14 in at least a bank of memory cells. The cell plate 16 in usually maintained at a voltage that is equal to one-half the supply voltage $V_{CC}$. The other plate 18 of each memory cell 14 is coupled to either a digit line D or a complementary digit line D# by respective access transistors 20. The gates of the access transistors 20 for all of the memory cells 14 in each row are normally connected to each other and to a common word line W. The access transistors 20 for all of the memory cells 14 in each column are connected to a common pair of digit lines D, D#. The digit lines D, D# for each column are coupled to a respective sense amplifier 30 and to a respective equilibration circuit 34.

In operation, the equilibration circuit 34 for each column couples the digit lines D, D# for the respective column to each other, and it also couples the digit lines D, D# for the respective column to $V_{CC}/2$. Thus, after the digit lines D, D# have been equilibrated, the voltage on both of the digit lines D, D# is one half the supply voltage.

When a memory cells 14 in a row are to be read, an actuation signal is applied to the word line W for that row, thereby causing all of the access transistors 20 in the row to couple a respective memory cell 14 in the row to one of a respective pair of digit lines D, D#. The voltage of the digit line D or D# to which a memory cell 14 has been coupled will then change slightly depending on which voltage is stored by the memory cell 14. If the memory cell is storing zero volts, the voltage of the digit line D or D# will decrease slightly. If the memory cell is storing $V_{CC}$, the voltage of the digit line D or D# will increase slightly. The reason why the change in voltage is only slight is that the digit lines D, D# have substantial intrinsic capacitance. The voltage on the digit lines D, D# increases or decreases by charge sharing, and, since the capacitance of the digit line D, D# is substantially greater than the capacitance of the memory cell 14 to which the digit line D or D# is coupled, the change in voltage is only slight. However, the voltage on one digit line D or D# will nevertheless be greater than or less than the voltage on the other digit line D# or D, respectively. In practice, the voltage stored by the memory cell 14 will not always be either $V_{CC}$ or ground because of the leakage of charge to or from the memory cell 14. However, a voltage stored by the memory cell 14 that is greater than $V_{CC}/2$ will still increase the voltage on the digit line D or D# to which it is coupled so that the voltage on the digit line D or D# will be greater than the voltage on the other digit line D# or D, respectively. Similarly, a voltage stored by the memory cell 14 that is less than $V_{CC}/2$ will still decrease the voltage on the digit line D or D# to which it is coupled so that the voltage on the digit line D or D# will be less than the voltage on the other digit line D# or D, respectively.

The sense amplifier 30 for each pair of digit lines D, D# senses which digit line has the greater voltage and which has the lesser voltage, and then drives the digit lines D, D# to either ground or $V_{CC}$. The sense amplifier 30 will drive the digit line D or D# having the greater voltage to $V_{CC}$, and it will drive the digit line D or D# having the lesser voltage to ground. The data bit stored in each column can then be read by coupling the digit lines for each column to respective differential amplifiers (not shown).

When the sense amplifier 30 drives one of the digit lines D or D# to $V_{CC}$ and the other digit line D# or D, respectively, to ground, the memory cell for the respective column is still coupled to the digit line D or D# by the access transistor 20. As a result, the full voltage ($V_{CC}$ or ground) to which the digit line D or D# is driven is coupled to the memory cell 14 for each column. Reading the memory cells 14 in a row thus restores the memory cells 14 to the full voltage to which they had previously been charged. For this reason, the above process is performed periodically for the memory cells 14 in each row by a process known as refresh, although the data "read" in each column is not coupled to the differential amplifier.

After the memory cells 14 have been read or refreshed, the actuating signal coupled to the word line W for the actuated row terminates, thereby substantially isolating the memory cells 14 from the respective digit line D or D# to which they were coupled. The equilibration circuit 34 for each column then drives the digit lines D, D# in the respective column to $V_{CC}/2$, as explained above, in preparation for a subsequent read or refresh of the same or a different row of memory cells 14.

The refresh process described above can cause a DRAM device to draw a substantial amount of current. Although the current drawn by each column is not significant, conventional DRAM device include a large number of columns, i.e, on the order of 10,000 or more. Therefore, even though the current drawn by each column of memory cells 14 may not be significant, the current drawn by all of the columns in a DRAM device being refreshed can be very significant. Even more significant are situations in which a large number of DRAM devices in a system are simultaneously refreshed. When a large number of DRAM device are simultaneously refreshed, the current drawn by all of the DRAM devices being refreshed can exceed the current supplying capabilities of a system containing the DRAM devices or at least create voltage transients or "spikes" on supply voltage lines that can cause other circuits that are connected to the same supply voltage lines to malfunction.

The memory cells 14 are refreshed using several different types of refresh procedures. In an auto-refresh procedure, and with some complex system designs, refreshes to all of the DRAM devices in a system may be initiated independently of each other. Therefore, refreshes can occur in the DRAM devices at different times so that the refresh current can be averaged over a period of time, thus limiting the peak current drawn. As a result, the problem of excessive peak current may not a problem for auto-refresh operations.

Excessively large peak current draws are normally not a problem for memory read operations because generally only a single DRAM device or single rank responds to each read command. Therefore, although the peak current drawn by the DRAM device being read may be substantial, it is the only DRAM device or rank in the system that is drawing such current.

Excessively large peak current draws may be a problem for self-refresh operations. In a self-refresh operation, a device such as a memory controller (not shown) may issue an self-refresh command to all of the DRAM devices or multiple ranks in a system. All of the DRAM devices then respond to the self-refresh command by immediately initiating a refresh of all of the memory cells 14 in the respective DRAM devices or multiple ranks. It is in this situation that the peak current drawn by the DRAM devices can cause the type of problems described above.

The problem of excessive currents resulting from DRAM refreshes has been recognized, and various attempts have been made to solve or at least alleviate this problem. In one conventional approach, a DRAM device includes internal refresh circuitry that staggers the refresh of each of several banks of memory cells so that all of the memory cells in the DRAM device are not being refreshed at the same time. Although this technique does minimize the current drawn by each DRAM device, it does not entirely solve the problem of a large number of DRAM devices in a system simultaneously responding to a self-refresh command. For example, when an self-refresh command is issued, all of the DRAM devices in the system will immediately initiate a refresh, albeit the refresh will occur simultaneously in only one memory bank of each DRAM device rather than in all of the memory banks of all of the DRAM devices. However, in systems with a large number of DRAM devices, the problem of excessive current draw can nevertheless be significant.

There is therefore a need for a technique that prevents all of the DRAM devices in a system from simultaneously initiating a refresh operation, such as in response to a self-refresh command issued to all of the DRAM devices in the system.

SUMMARY OF THE INVENTION

A plurality of DRAM devices in a memory system are each configured with a delay value. When a refresh command is issued simultaneously to the DRAM devices, the DRAM devices initiate refreshes of their memory cells at different times corresponding to their respective delay values. As a result, the current drawn by the DRAM devices in conducting the refreshes are spread over the period during which the DRAM devices are initiating the refreshes, thereby limiting the peak current consumption of the DRAM devices in the memory system. The DRAM devices may be configured by storing a delay value corresponding to a number of system clock signal periods and/or fraction thereof. The DRAM devices will then delay initiating a refresh in response to a refresh command until after the clock periods corresponding to the delay value.

DETAILED DESCRIPTION

Figure 2:
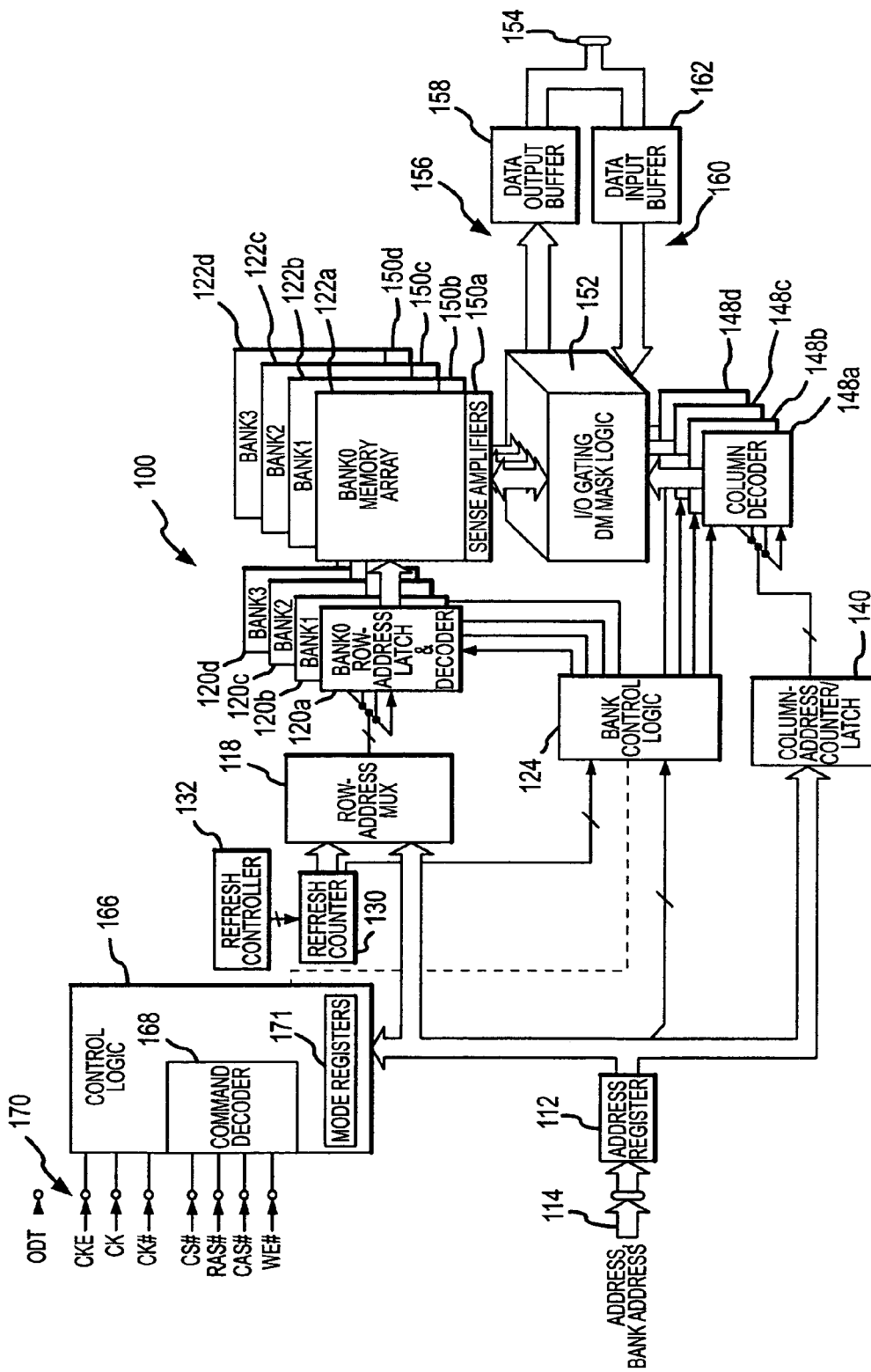
FIG. 2 is a block diagram of a conventional dynamic random access memory device.

A typical synchronous dynamic random access memory ("SDRAM") device 100 that can use various embodiments of the present invention described below is shown in FIG. 2. The SDRAM 100 includes an address register 112 that receives either a row address or a column address on an address bus 114. The address bus 114 is generally coupled to a memory controller (not shown in FIG. 2). Typically, a row address is initially received by the address register 112 and applied to a row address multiplexer 118. The row address multiplexer 118 couples the row address to row address latches and decoder 120a–d, which are, in turn, coupled to respective banks 122a–d of DRAM memory cell arrays. The row address latches and decoders 120a–d stores the row address and decodes the stored address to apply row actuating signals to the memory cells in the respective banks. The row address multiplexer 118 also couples row addresses to the row address latches and decoders 120a–d for the purpose of refreshing the memory cells in the banks 122. The row addresses are generated for refresh purposes by a refresh counter 130, which is controlled by a refresh controller 132. Although the row address multiplexer 118 couples the row address signals to all of the address latches and decoders 120a–d, only one of the address latches and decoders 120a–d is selected to respond to the address signals by bank control logic 124. The bank control logic 124 receives two bits are a bank address from the address register 112, which is normally coupled through the address bus 114 along with the row address. However, during a refresh, the refresh counter 130 issues a bank address which causes the bank control logic 124 to select the appropriate address latch and decoder 120a–d.

After the row address has been applied to the address register 112 and processed by one of the row address latches and decoders 120a-d, a column address is applied to the address register 112 through the address bus 114. The address register 112 couples the column address to a column address latch and counter 140. The column address latch and counter 140 stores the column address received from the address register, and then outputs the stored address. The column address latch and counter 140 also includes a counter that generates and outputs a sequence of column address when the SDRAM 100 is operating in a burst operating mode. In either case, the column addresses output from the column address latch and counter 140 are coupled to four column decoders 148a–d which applies column select signals corresponding to the column addresses to respective sense amplifiers 150a–d through input/output mask logic 152. However, the bank control logic 124 selects the signals from only one of the column decoders 148 a–d for coupling to the sense amplifiers 150a–d. The input/output mask logic 152 prevents the column select signals generated by the column address latch and counter 140 from being applied to the sense amplifiers 150a–d under certain situations.

As is well known in the art, the sense amplifiers 150a–d each include a sense amplifier for each column of memory cells in its respective bank 122a–d, and it outputs a read date bit for a read memory access. Each of the sense amplifiers 150a–d also includes a write driver (not shown) that couples a write data bit to a memory cell in its respective column for a write memory access. The read data bits are coupled from the sense amplifiers 150a–d to external data bus terminals 154 through a read data path 156, which includes a data output buffer 158. Write data bits are coupled from the external data bus terminals 154 to the sense amplifiers 150a–d through a write data path 160, which includes a data input buffer 162.

The above-described operation of the SDRAM 100 is controlled by control logic 166, which includes a command decoder 168 receiving and decoding command signals received on a command bus 170. These high level command signals, which are typically generated by a memory controller (not shown), are a clock enable signal CKE, complimentary clock signals CK, CK#, a chip select signal CS#, a row address strobe signal RAS#, a column address strobe signal CAS#, and a write enable signal WE#, the "#" designating the signal as active low. Various combinations of these signals are registered as respective commands, such as a read command or a write command. The control logic 166 generates a sequence of control signals responsive to the command signals decoded by the command decoder 168 to carry out the function (e.g., a read or a write) designated by each set of the command signals. These command signals, and the manner in which they accomplish their respective functions, are conventional. Therefore, in the interest of brevity, a further explanation of these control signals will be omitted except for a discussion of commands to enter various refresh modes.

Figure 1:
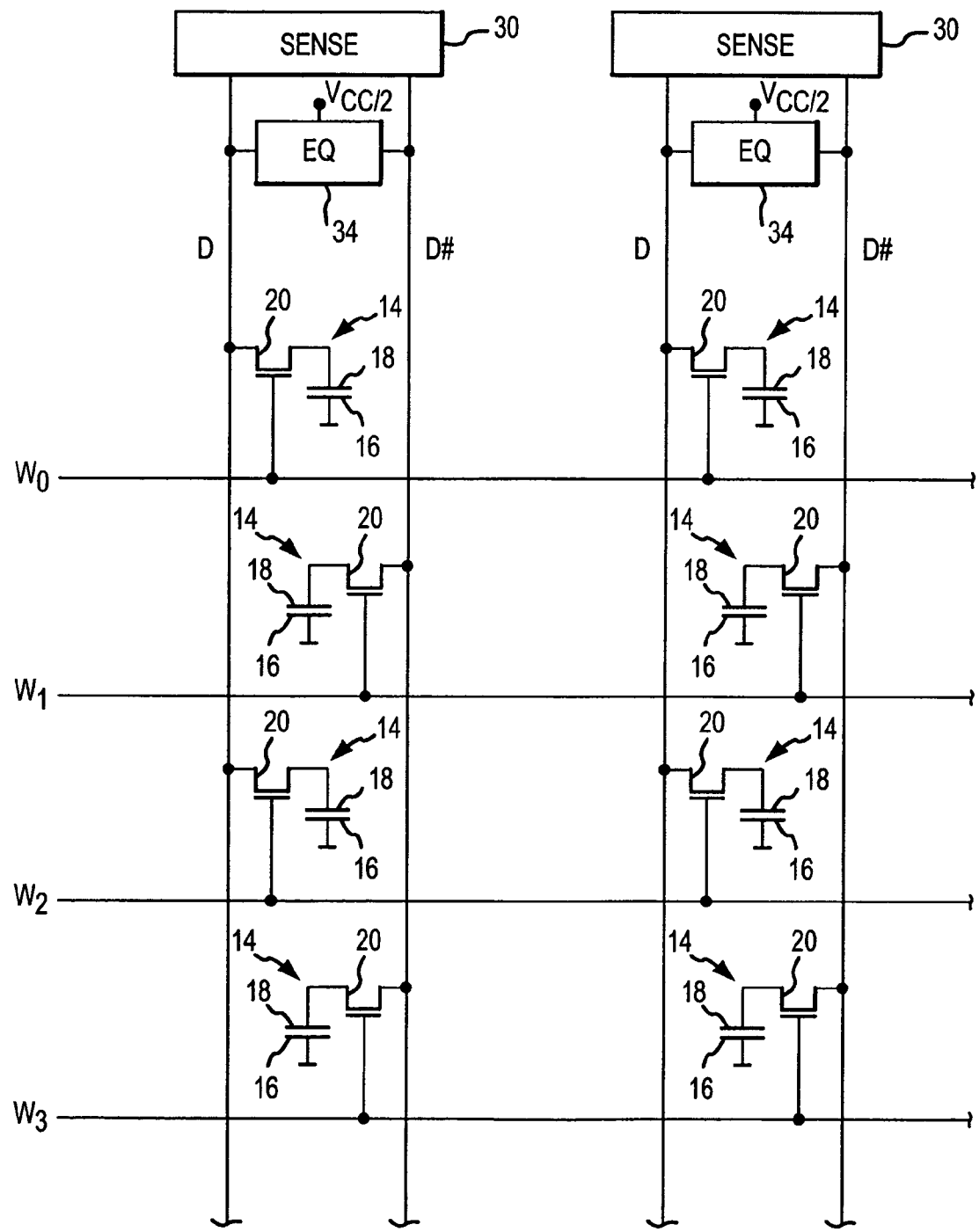
FIG. 1 is a schematic and block diagram of a portion of a conventional dynamic random access memory cell array.

The two refresh commands that can be decoded by the command decoder 168 are the auto-refresh command and the self-refresh command. Both of these refresh commands are registered by applying active low CS#, RAS#, and CAS# signals, and a high WE# signal to the command decoder 168. The refresh command is registered as an auto-refresh command if the CKE signal is high, and it is registered as a self-refresh command if CKE is low. The auto-refresh command is applied to the command decoder 168 each time an auto-refresh is to occur, which must be fairly frequent to avoid loss of data. In response to the auto-refresh command, the refresh counter 130 increments to generate a sequence of addresses, and the refresh controller 132 causes the control logic 166 to output control signals to perform the refresh operation explained above with reference to FIG. 1. Currently, the auto-refresh command is normally issued to only a single SDRAM device 100 or limited number of SDRAM devices at a time. As a result, the problem of excessive current draws caused by a large number of SDRAMs entering refresh generally does not occur or the system power supply has increased capabilities to handle the surge of current.

The self-refresh command need not be issued to the SDRAM 100 each time a refresh is to occur. Instead, once the self-refresh command is issued to the SDRAM 100, the SDRAM 100 continues to periodically initiate refreshes as described above until a command is issued to the SDRAM 100 to terminate the self-refresh. As previously explained, it is common to issue the self-refresh command 100 simultaneously to all DRAM devices in a system, and, in response to the self-refresh command, all of the DRAM devices immediately initiate a refresh. As a result, the peak current consumption can be very substantial.

The control logic 166 also includes a set of mode registers 171 that are loaded with mode bits to define the operating modes or features of the SDRAM 100. For example, the bits loaded in the mode registers 171 may define the burst length and type for operating in a burst access mode, the read latency, and other operating parameters, and they may disable internal circuitry, such a delay lock loops (not shown in FIG. 2) used in the SDRAM 100. The mode registers 171 also include a number of unused bits that are reserved for future enhancements.

Figure 3:
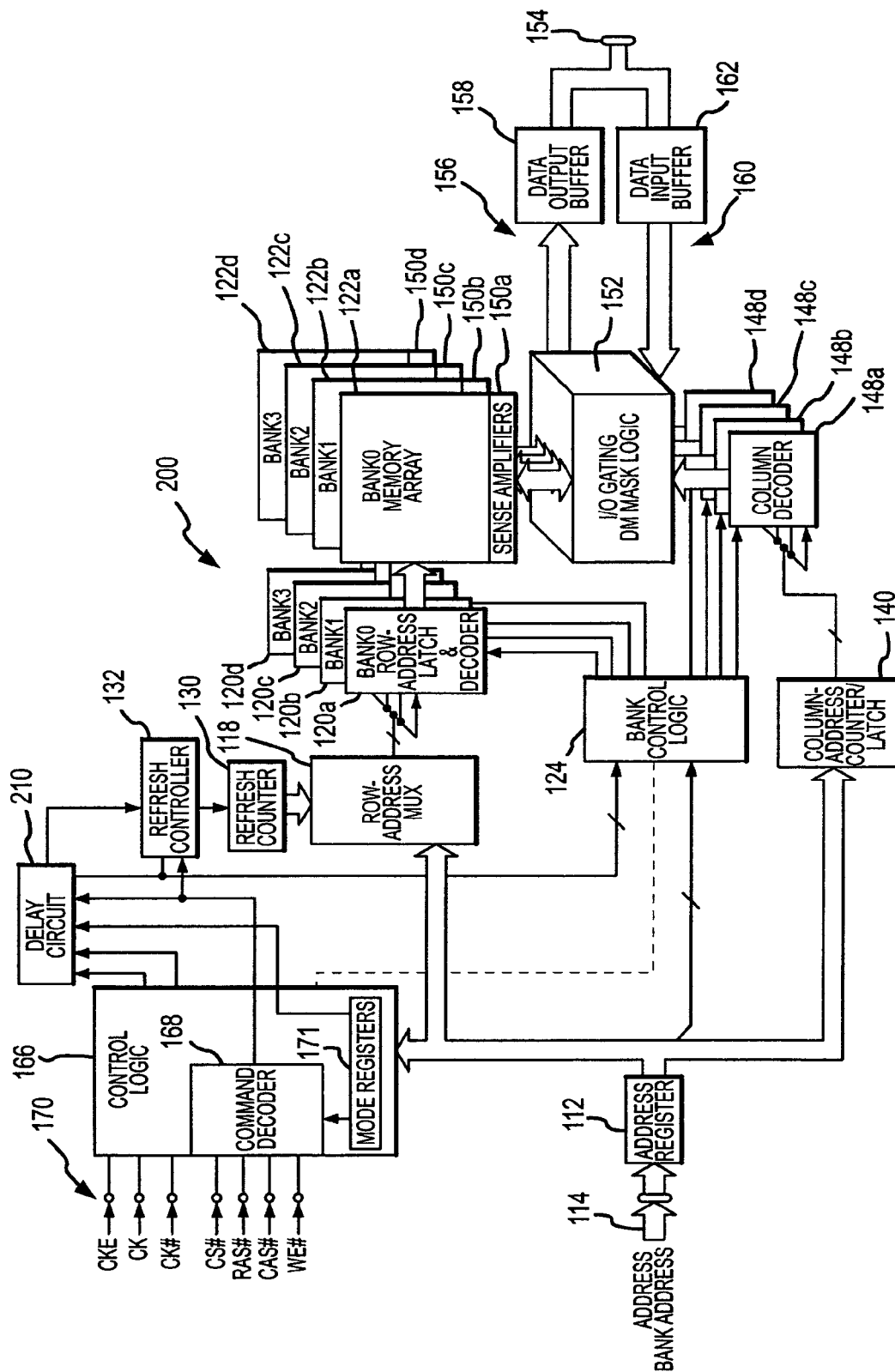
FIG. 3 is a block diagram of a dynamic random access memory device according to one embodiment of the invention.

One embodiment of an SDRAM device 200 that is capable of minimizing peak current draws responsive to a self-refresh command being issued to a large number of the SDRAM devices 200 is shown in FIG. 3. The SDRAM device 200 includes all of the components that are included in the SDRAM device 100. Therefore, in the interest are brevity, common components have been provided with the same reference numerals, and a description of their function and operation will not be repeated. The SDRAM device 200 differs from the SDRAM device 100 by including a delay circuit 210 and that controls the operation of the refresh controller 132. The structure and operation of the refresh controller 210 will be described in greater detail below. However, the delay circuit 210 basically functions to delay the initiation of a refresh responsive to either an auto-refresh command or a self-refresh command for a specific number of periods of the clock signals CK, CK# or portions thereof. The delay in initiating a refresh after a refresh command is given is programmable in each of the SDRAM devices 200 in a system so that all of the SDRAM devices 200 need not initiate a refresh at the same time in response to a refresh command issued simultaneously to all of the SDRAM devices 200.

Figure 4:
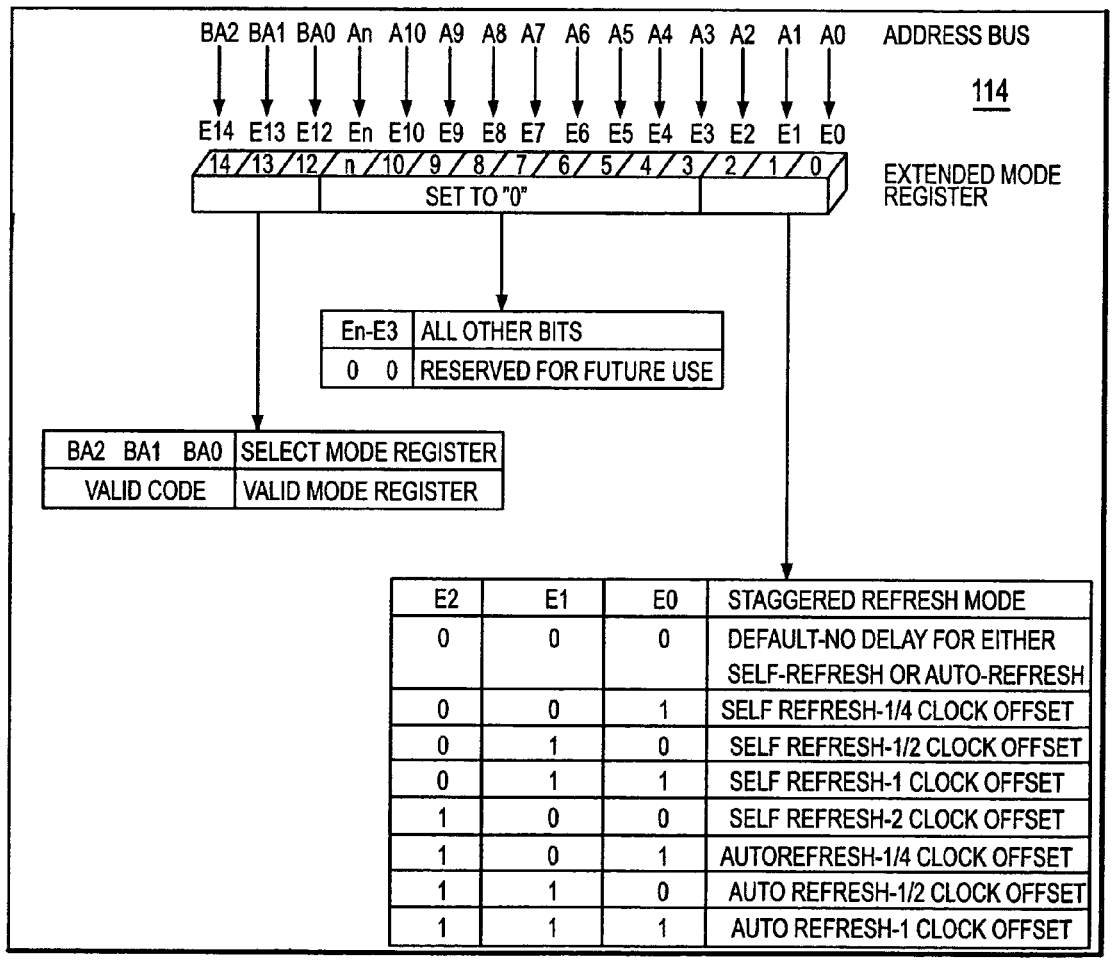
FIG. 4 is a schematic illustration showing the manner in which the memory device of FIG. 3 is programmed with a delay value.

Although the magnitude of the delay in initiating a refresh can be programmed in the SDRAM device 200 using a variety of techniques, in one embodiment the magnitude of the delay is programmed by programming the mode register 171. A chart showing one embodiment of how the mode register 171 can be programmed is illustrated in FIG. 4. The mode register 171 is programmed through the address bus 114 using the three low-order bits E2–E0 or other available bits to select a delay in using the three high order bits E14–E12, which is normally reserved for a bank address, to select the proper one of several mode registers 171 that is to be programmed. As shown in FIG. 4, a value for E2–E0 of "000" does not provide any delay, and will therefore cause the SDRAM device 200 to the immediately initiate a refresh responsive to receiving either a self-refresh or an auto-refresh command. A value for E2–E0 of "001" provides ¼ clock delay in responding to a self-refresh command, a value of "010" provides a delay of one-half a period of the clock signal in responding to a self-refresh command, a value of "011" provides a delay of one period of the clock signal in responding to a self-refresh command, and a value of "100" provides a delay of two periods of the clock signal in responding to a self-refresh command. The SDRAM device 200 may also delay responding to an auto refresh command. This is accomplished by programming the appropriate mode register 171 with a value of "101" to provide ¼ clock delay in responding to the auto-refresh command, "110" to provide a delay of one-half a period of the clock signal to respond to the auto-refresh command, and "111" to provide a delay of one clock period to respond to the auto-refresh command. Thus, in the self-refresh refresh mode, a large number of the SDRAM devices 200 in a system can be divided into four different groups, and all of the SDRAM devices 200 in each of the groups can made to respond at different times to a self-refresh command simultaneously issued to all of the SDRAM devices 200. It will be understood, however, that additional bits of the mode register 171 can be programmed to increase the variety of delays in responding to both self-refresh command and/or auto-refresh commands to allow a large number of the SDRAM devices 200 in a system to be divided into a larger number of groups.

In operation, the command decoder 168 couples control signals decoded from the auto-refresh or self-refresh commands to either the delay circuit 210 or the refresh controller 132 depending on the settings in the mode registers 171. If the delay the refresh is enabled by the settings in the mode register 171, the delay circuit 210 waits for the appropriate number of clock cycles or fractions thereof and then issues the control signals for either an auto-refresh command or a self-refresh command to the refresh controller 132. If the delayed refresh mode is not enabled, the command decoder 168 issues control signals corresponding to the auto-refresh command or self-refresh command directly to the refresh controller 132.

Figure 5:
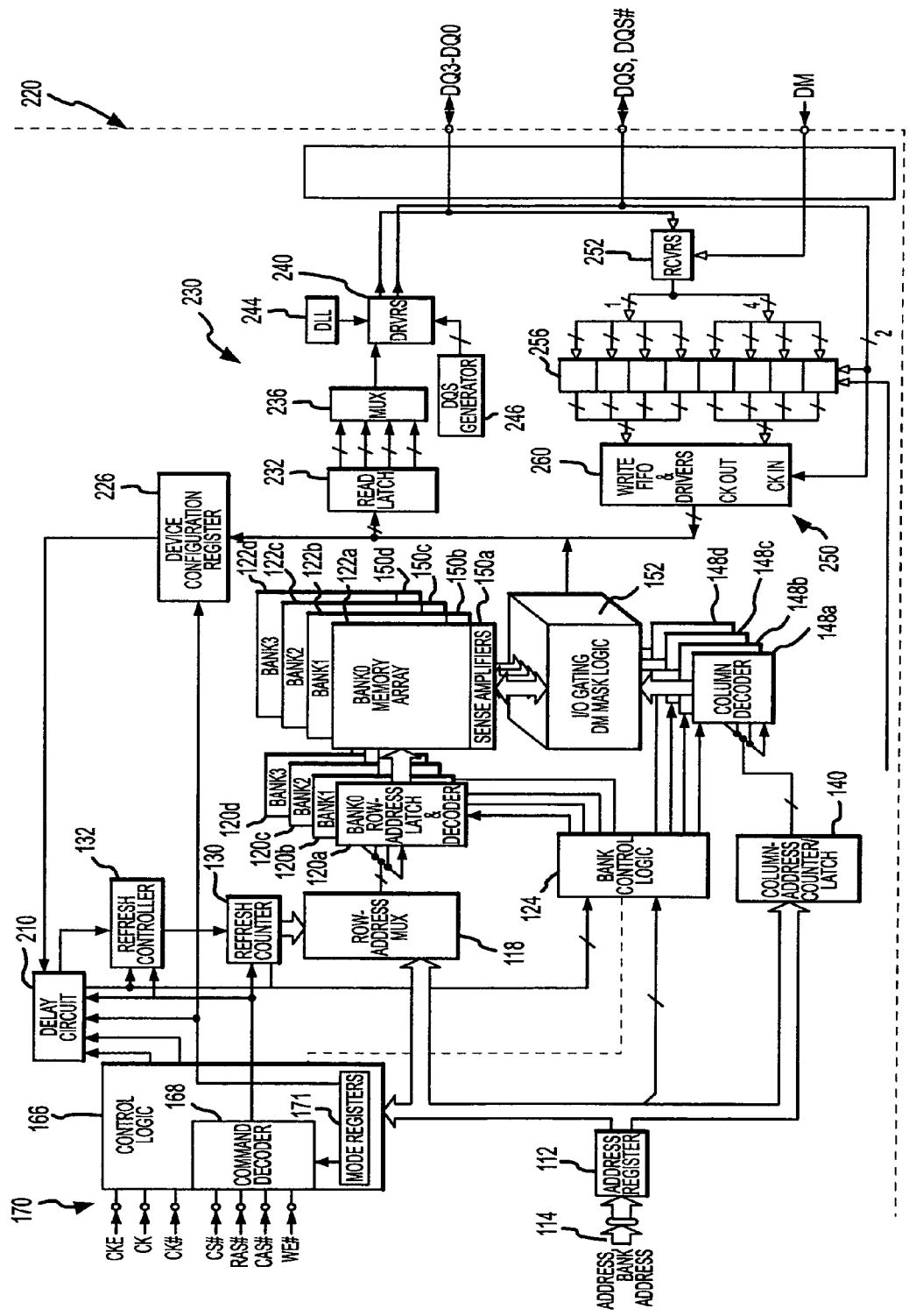
FIG. 5 is a block diagram of a dynamic random access memory device according to another embodiment of the invention.

An SDRAM device 220 according to another embodiment of the invention is shown in FIG. 5. The SDRAM device 200 again uses most of the components that are used in the SDRAM 100 of FIG. 2 and the SDRAM 200 of FIG. 3, and these common components have again been provided with the same reference numerals. The SDRAM device 220 differs from these previously described SDRAM devices 100, 200 by using a device configuration register 226 coupled to the delay circuit 210 and by using data paths that are somewhat different from the data paths 156, 160 used in the SDRAM 200 of FIG. 3. More specifically, the SDRAM 220 includes a read data path 230 having a read latch 232 that receives read data bits from the sense amplifiers 150a–d through the I/O gating mask logic 152. Sixteen bits of read data are coupled to the latch 232 and output to a read data multiplexer 236 in four groups each containing four data bits. The multiplexer 236 selects one of these four-bit groups of read data responsive to two bits of a column address. The four selected read data bits are then latched into read data driver 240 and coupled to a 4-bit data bus DQ3–DQ0 responsive to signals generated from the complimentary clock signals CK, CK# by a delay-locked loop 244. A data strobe signal generated by a DQS generator 246 is also latched into the read data driver 240 to generate complementary read data strode signals DQS, DQS#, which are output from the SDRAM 220 along with the read data. Although the SDRAM device 220 of FIG. 5 has an external data bus of 4-bits and an internal data bus of 16-bits, it will be understood that external and internal data buses having different numbers of data bits may be used.

A write data paths 250 includes a write data receiver 252 that receives 4 bits of data from the data bus DQ3–DQ0 along with a data mask "DM" signal. The write data receiver 252 couples four data bits and the DM signal to a pair of multiplexers 256 that sequentially select each 4-bit set of data and corresponding DM signal for coupling to a write FIFO and driver 260 responsive to two bits of the column address. Each 4-bit set of data and corresponding DM signal are latched into the write FIFO and driver 260 responsive to received complimentary write data strobe signals DQS, DQS#, which are coupled to the same terminals of the SDRAM 220 to which the read data strobe signals DQS, DQS# are coupled. The write FIFO and driver 260 then couples the accumulated 16-bits of write data to the sense amplifiers 150a–d responsive to the complimentary clock signals CK, CK#.

The write FIFO and Driver 260 is also coupled to the device configuration register 226 so that it can be programmed through the data bus terminals DQ3–DQ0. The manner in which the device configuration register 226 is programmed and used will now be explained with reference to FIGS. 6 and 7. Basically, however, the mode register 171 in the SDRAM 220 is programmed with a base delay value, which is coupled to the delay circuit 210. The device configuration register 226 is also programmed with an adjustment code through the data bus DQ3–DQ0. The device configuration register 226 couples the adjustment code to the delay circuit 210, which then offsets any auto-refresh command or self-refresh command with a delay corresponding to the product of the base delay value and the adjustment code.

Figures 6, 7:
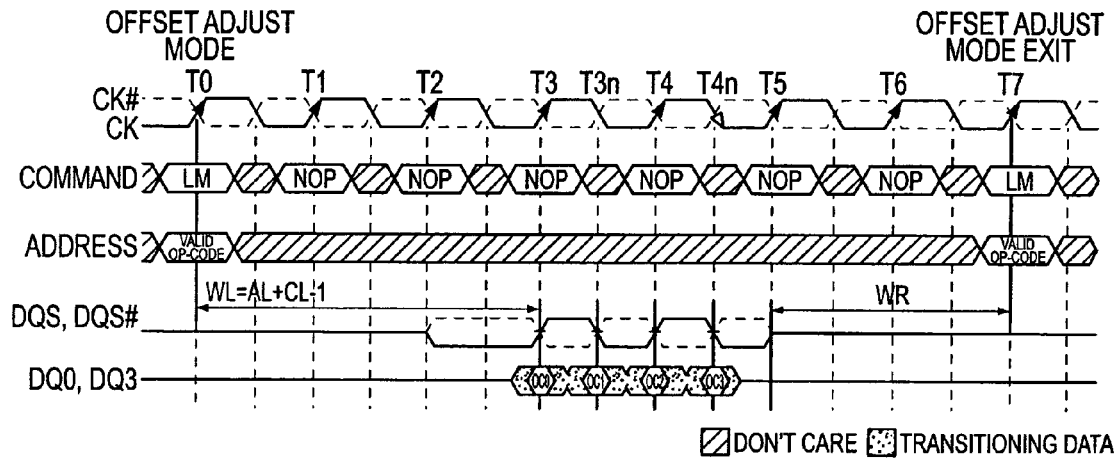
FIG. 6 is a timing diagram showing the manner in which the memory device of FIG. 5 is programmed with an adjustment code.
FIG. 7 is chart showing multiplier values corresponding to various adjustment codes for use in the memory device of FIG. 5.

With reference to FIG. 6, a load mode register command is clocked into the command decoder 168 at time $T_0$. At the same time, the address bits shown in FIG. 4 are applied to the address bus 114 (FIG. 5). As a result, the mode register 171 is loaded with either an auto-refresh base delay value or a self-refresh base delay value. The base delay value programmed into the mode register 171 is then coupled to the delay circuit 210. Thus, the delay circuit 210 receives the base delay value in substantially the same way that the delay circuit 210 in the SDRAM 200 received a delay value. As further shown in FIG. 6, four bits of data are sequentially clocked into the write FIFO and drivers 260 responsive to four transitions of the data strobe signals DQS, DQS# starting at time $T_3$. The actual coupling of the four bits is preferably accomplished by setting one of the mode registers 171 to program a burst length of four bits and to select and adjust offset mode. The SDRAM 220 will then mimic a write cycle to capture the adjustment code applied to the data bus terminals DQ3–DQ0. The reason why each bit is applied to all four data bus terminals DQ3–DQ0 is that the actual data bus terminal on which a data signal is received is often scrambled for efficiency in routing conductors to the data bus terminals. For example, a data bit D1 may be coupled to one SDRAM through the D0 data bit terminal and to another SDRAM through the D4 data bit terminal. By routing the data bits to all four terminals, the applied data bits can always be coupled to the device configuration register 226. The device configuration register 226 thus receives four bits of data corresponding to a delay multiplier, and it couples these four bits to the delay circuit 210.

The correspondence between the 4-bit adjustment codes and the multiplier values are shown in FIG. 7, which a first set of values for the self-refresh mode and a second set of values for the auto-refresh mode. The adjustment codes coupled to the device configuration register 226 from the data bus terminals DQ3–DQ0 are designated as being for either the self-refresh mode or the auto-refresh mode based on the value of a signal applied to another terminal of the SDRAM 220. As further shown in FIG. 7, the four adjustment code bits allow 16 values of adjustment codes to be programmed into the offset decode logic 226, ranging from a multiplier value of 0 to a multiplier value of 3¾.

The manner in which the SDRAM devices 220 are programmed will depend to some extent on the manner in which they are coupled to a memory controller or other device. Typically several SDRAM devices 220 are mounted on a substrate in a memory module, and several memory modules or used. The SDRAM devices 220 often arranged in "ranks" each consisting of a subset of the SDRAM devices 220 in each module. There is normally a separate chip select signal CS# for each of the ranks so that each rank can be individually selected. Additionally, the SDRAM 220 devices in corresponding positions in each rank are provided with respective data strobe DQS, data inputs DQ and data mask DM signals. It is therefore possible to program each SDRAM device 220 by applying a chip select signal CS# to the SDRAM devices 220 in a specific rank and then apply a unique combination of DQS, DQ and DM signals to only access one (or any) of the SDRAM devices 220 in the selected rank. In this manner, each SDRAM device 220 in a computer system can be provided with a respective delay for initiating a refresh responsive to an auto-refresh or self-refresh command issued to all of the SDRAM devices 220 in a system. The peak current draw of a system containing a large number of SDRAM devices 220 can therefore be maintained relatively low.

In another embodiment of the invention, the delay value is set by the sum of the base delay value and the adjustment code rather than the product of the base delay value and the adjustment code as in the SDRAM 220 of FIG. 5. The base delay value preferably serves as a coarse delay value while the bits that constitute the adjustment code in the SDRAM 220 serve as a fine delay value. Other variations may also be used.

Various embodiments of the invention may also be used in memory systems in which DRAM devices are not directly coupled to a memory controller or other device. For example, a memory system 270 shown in FIG. 8 includes a memory hub controller 272 coupled to several memory modules 276*a,b . . . n*. The memory modules 276*a,b . . . n* are preferably coupled to the memory hub controller 272 through a high-speed link 278, which may be an optical or electrical communication path or some other type of communications path. The memory modules 276*a,b . . . n* are shown coupled to the memory hub controller 272 in a multi-drop arrangement in which the single high-speed link 278 is coupled to all of the memory modules 276*a,b . . . n*. However, it will be understood that other topologies may also be used.

Figure 8:
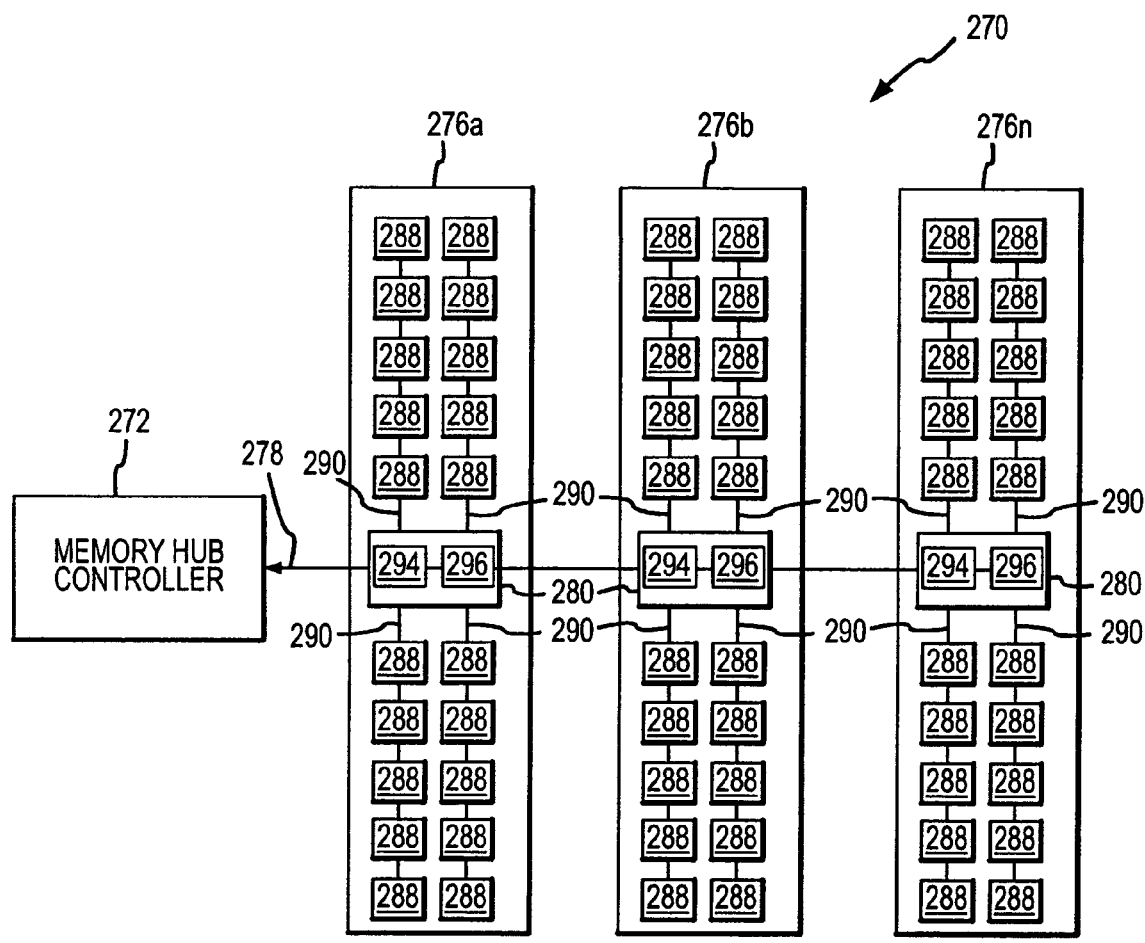
FIG. 8 is a block diagram of a memory system using several dynamic random access memory devices according to another embodiment of the invention.

Each of the memory modules 276*a,b . . . n* includes a memory hub 280 for controlling access to 32 DRAM devices 288, which, in the example illustrated in FIG. 8, are SDRAM devices. However, a fewer or greater number of SDRAM devices 288 may be used, and DRAM devices other than SDRAM devices may, of course, also be used. The memory hub 280 is coupled to each of the SDRAM devices 288 through a bus system 290, which normally includes a control bus, an address bus and a data bus.

Each of the memory hubs 272 includes a register 294 coupled to a delay circuit 296. The register 294 is programmed with a delay value, which can also serve as a base delay value. The register 294 or some other component in the memory hub 280 may also be programmed with a code that is used to generate a delay value corresponding to either the product of the base delay value and the code or the sum of the base delay value and the code. The delay value and possibly the code stored in the register 294 are coupled to the delay circuit 296. In operation, the delay circuit 296 causes the memory hub 280 to respond to an auto-refresh command or a self-refresh command by delaying the issuance of the command to the SDRAM devices 288 for a period corresponding to the delay value applied to the delay circuit 296. In one embodiment, the memory hub 280 applies the auto-refresh or self-refresh command to all the SDRAM devices 288 simultaneously after the delay period. In other embodiments, the memory hub 280 simultaneously applies the auto-refresh or self-refresh command to the SDRAM devices 288 in each rank, but does not apply the command to the SDRAM devices 288 in different ranks at the same time. In still other embodiments of the invention, the memory hub 280 applies auto-refresh or self-refresh commands individually to each of the SDRAM devices 288 at different times. Various embodiments for offsetting an auto-refresh command or a self-refresh command in accordance with the invention may also be used in other types of memory systems.

Figure 9:
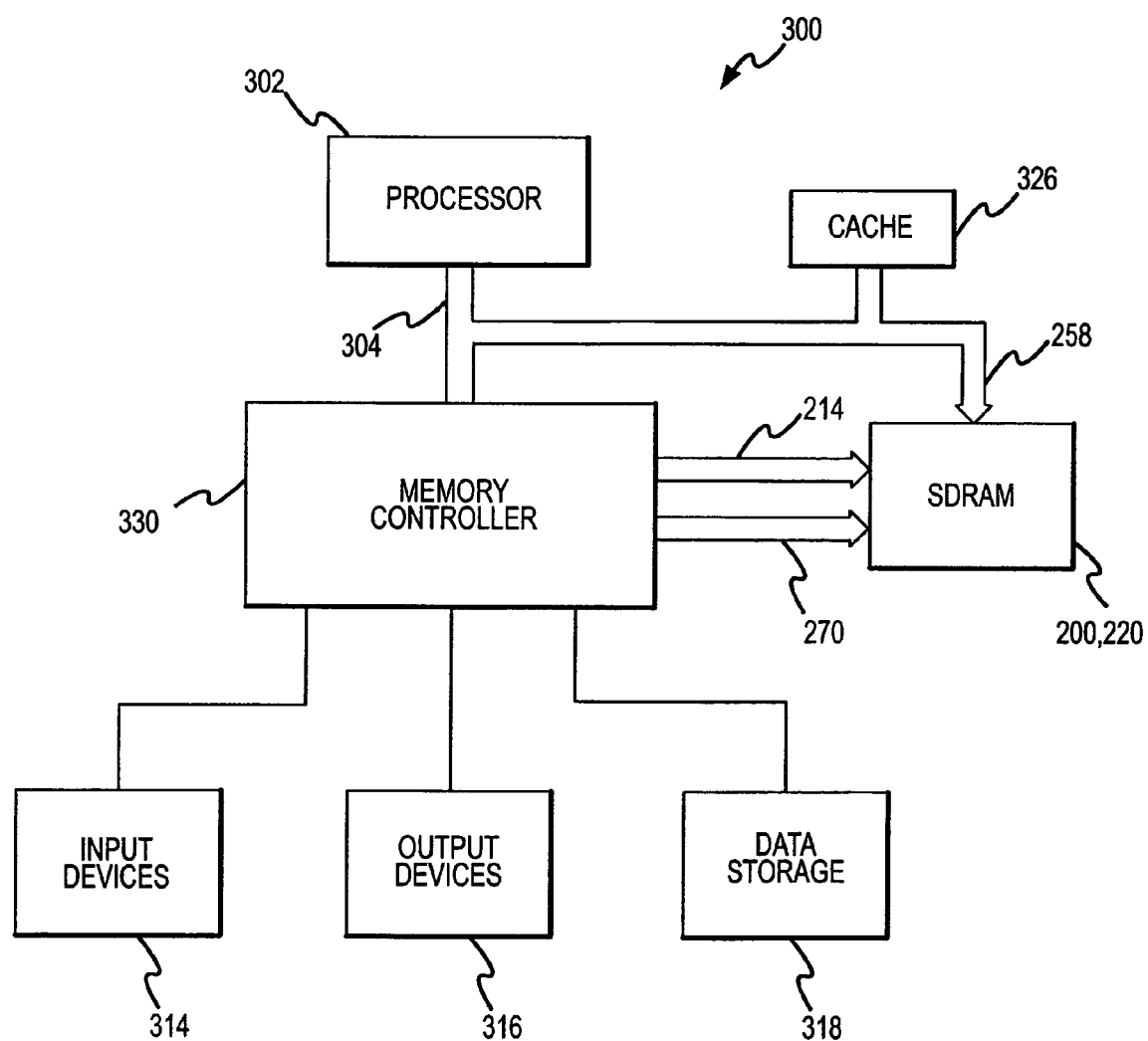
FIG. 9 is a block diagram of an embodiment of a computer system using dynamic random access memory device according to various embodiments of the invention.

A computer system 300 containing the SDRAM 200 of FIG. 3 or the SDRAM 220 of FIG. 5 is shown in FIG. 9. The computer system 300 includes a processor 302 for performing various computing functions, such as executing specific software to perform specific calculations or tasks. The processor 302 includes a processor bus 304 that normally includes an address bus, a control bus, and a data bus. In addition, the computer system 300 includes one or more input devices 314, such as a keyboard or a mouse, coupled to the processor 302 to allow an operator to interface with the computer system 300. Typically, the computer system 300 also includes one or more output devices 316 coupled to the processor 302, such output devices typically being a printer or a video terminal. One or more data storage devices 318 are also typically coupled to the processor 302 to allow the processor 302 to store data in or retrieve data from internal or external storage media (not shown). Examples of typical storage devices 318 include hard and floppy disks, tape cassettes, and compact disk read-only memories (CD-ROMs). The processor 302 is also typically coupled to cache memory 326, which is usually static random access memory ("SRAM"), and to the SDRAM 200, 220 through a memory controller 330. The memory controller 330 normally includes the control bus 270 and the address bus 214 that are coupled to the SDRAM 200, 220. The data bus 258 is coupled from the SDRAM 200, 220 to the processor bus 304 either directly (as shown), through the memory controller 330, or by some other means.

Although the present invention has been described with reference to the disclosed embodiments, persons skilled in the art will recognize that changes may be made in form and detail without departing from the spirit and scope of the invention. Such modifications are well within the skill of those ordinarily skilled in the art. Accordingly, the invention is not limited except as by the appended claims.

We claim:

1. A method of refreshing memory cells in a memory system having a plurality of dynamic random access memory ("DRAM") devices, the method comprising:
   programming a plurality of the DRAM devices in the memory system with respective delay configurations, at least some of the DRAM devices being programmed with different delay configurations, wherein the act of programming the plurality of DRAM devices in the memory system with respective delay configurations comprises:
  programming each of the DRAM devices with a respective base delay value;
  programming each of the DRAM devices with a respective delay adjustment value; and
  combining the respective base delay value with the respective delay adjustment value in each of the DRAM devices to provide the respective delay configuration;
applying a refresh command to the plurality of the DRAM devices in the memory system; and
initiating a refresh of the memory cells in each of the plurality of the DRAM devices responsive to the refresh command after respective delays corresponding to the programmed delay configurations of the DRAM devices.

2. The method of claim 1 wherein the act of programming a plurality of the DRAM devices in the memory system with respective delay configurations comprises programming a mode register in each of the DRAM devices.

3. The method of claim 1 wherein the act of combining the respective base delay value with the respective delay adjustment value in each of the DRAM devices to provide the respective delay configuration comprises multiplying the respective base delay value by the respective delay adjustment value.

4. The method of claim 1 wherein the act of combining the respective base delay value with the respective delay adjustment value in each of the DRAM devices to provide the respective delay configuration comprises adding the respective base delay value to the respective delay adjustment value.

5. The method of claim 1 wherein the act of programming each of the DRAM devices with a respective delay adjustment value comprises:
  applying the respective delay adjustment values to respective data bus terminals of the DRAM devices; and
  coupling the respective delay adjustment values to respective internal registers for storage in the DRAM devices.

6. The method of claim 1 wherein the act of programming each of the DRAM devices with a respective base delay value comprises programming the base delay value in respective mode registers in the DRAM devices.

7. The method of claim 1 wherein the DRAM devices comprise synchronous DRAM devices operating in synchronism with a clock signal, wherein the programmed delay configurations comprise respective portions of one or more periods of the clock signal, and wherein the act of initiating a refresh of the memory cells in each of the plurality of the DRAM devices responsive to the refresh command after respective delays corresponding to the programmed delay configurations comprises initiating a refresh of the memory cells in the plurality of the DRAM devices responsive to the refresh command after respective delays equal to respective portions of one or more periods of the clock signal corresponding to the respective programmed delay configurations.

8. The method of claim 1 wherein the refresh command comprises a self-refresh command.

9. The method of claim 1 wherein the refresh command comprises an auto-refresh command.

10. The method of claim 1 wherein the DRAM devices are included in a memory module having a memory hub coupled to the DRAM devices, and wherein the act of applying a refresh command to a plurality of the DRAM devices in the memory system comprises applying the refresh command to the memory hub, the memory hub being operable to couple a corresponding refresh command to the DRAM devices to which it is coupled.

11. The method of claim 10 wherein the act of programming the plurality of the DRAM devices in the memory system with respective delay configurations comprises programming the memory hub with at least one delay configuration.

12. The method of claim 11 wherein the act of initiating a refresh of the memory cells in a plurality of the DRAM devices responsive to the refresh command after respective delays corresponding to the respective programmed delay configurations comprises simultaneously initiating a refresh of the memory cells in all of the DRAM devices in the memory module responsive to the memory hub receiving the refresh command after a delay corresponding to the respective programmed delay configuration.

13. In a memory system having a plurality of dynamic random access memory ("DRAM") devices each of which including a plurality of memory cells, a method of refreshing the memory cells comprising:
  configuring a plurality of the DRAM devices so that at least some of the DRAM devices initiate a refresh of the memory cells in the respective DRAM devices at different times in response to receiving a refresh command, wherein the act of configuring a plurality of the DRAM devices comprises:
    configuring the DRAM devices with respective base delay values;
    configuring the DRAM devices with respective delay adjustment values; and
    combining the base delay value with the delay adjustment value in each of the DRAM devices; and
  issuing the refresh command simultaneously to the plurality of the DRAM devices that have been configured to initiate a refresh of the memory cells at different times in response to receiving a refresh command.

14. The method of claim 13 wherein the act of configuring a plurality of the DRAM devices comprises programming a mode register in each of the DRAM devices.

15. The method of claim 13 wherein the act of combining the base delay value with the delay adjustment value in each of the DRAM devices comprises multiplying the base delay value by the delay adjustment value.

16. The method of claim 13 wherein the act of configuring the DRAM devices with respective delay adjustment values comprises:
  applying the delay adjustment values to data bus terminals of the respective DRAM devices; and
  coupling the delay adjustment values to respective internal registers for storage in the DRAM devices.

17. The method of claim 13 wherein the act of configuring the DRAM devices with respective base delay values comprises programming the base delay values in a mode register in each of the DRAM devices.

18. The method of claim 13 wherein the refresh command comprises a self-refresh command.

19. The method of claim 13 wherein the refresh command comprises an auto-refresh command.

20. The method of claim 13 wherein the DRAM devices are included in a memory module having a memory hub coupled to the DRAM devices, and wherein the act of issuing a refresh command simultaneously to a plurality of the DRAM devices comprises issuing the refresh command to the memory hub, the memory hub being operable to issue a corresponding refresh command to the DRAM devices to which it is coupled.

21. The method of claim 20 wherein the act of configuring a plurality of the DRAM devices comprises configuring the memory hub so that the memory hub issues refresh commands to the DRAM devices at different times in response to receiving a refresh command.

22. In a synchronous dynamic random access memory ("SDRAM") device having a plurality of memory cells, a method of refreshing the memory cells, comprising:
coupling a clock signal to the SDRAM device;
configuring the SDRAM device with a delay interval corresponding to a portion of at least one period of the clock signal, wherein the act of configuring the SDRAM device with a delay interval comprises:
configuring the SDRAM device with a base delay value;
configuring the SDRAM device with a delay adjustment value; and
combining the base delay value with the delay adjustment value to obtain the delay interval; and
in response to receiving a refresh signal, initiating a refresh of the memory cells in the SDRAM device after the delay interval.

23. The method of claim 22 wherein the act of configuring the SDRAM device with a delay interval comprises programming a mode register in the SDRAM device.

24. The method of claim 22 wherein the act of combining the base delay value with the delay adjustment value to obtain the delay interval comprises multiplying the base delay value by the delay adjustment value.

25. The method of claim 22 wherein the act of combining the base delay value with the delay adjustment value to obtain the delay interval comprises adding the base delay value to the delay adjustment value.

26. The method of claim 22 wherein the act of configuring the SDRAM device with a respective delay adjustment value comprises:
applying the delay adjustment value to data bus terminals of the respective SDRAM device; and
coupling the delay adjustment value to an internal register for storage in the SDRAM device.

27. The method of claim 22 wherein the act of configuring the SDRAM device with a base delay values comprises programming the base delay value in a mode register in the SDRAM device.

28. The method of claim 22 wherein the refresh command comprises a self-refresh command.

29. A method of refreshing memory cells in a memory system having a plurality of dynamic random access memory ("DRAM") devices in a memory module, the memory module having a memory hub coupled to the DRAM devices, the method comprising:
programming the memory hub with at least one delay configuration, wherein the act of programming the memory hub with at least one delay configuration comprises:
programming the memory hub with a base delay value;
programming the memory hub with a delay adjustment value; and
combining the base delay value with the delay adjustment value in the memory hub to provide the delay configuration;
applying a refresh command to the memory hub, the memory hub operable to couple a corresponding refresh command to the DRAM devices to which it is coupled; and
simultaneously initiating a refresh of the memory cells in all of the DRAM devices in the memory module responsive to the memory hub receiving the refresh command after a delay corresponding to the respective programmed delay configuration.

30. The method of claim 29 wherein the act of combining the base delay value with the delay adjustment value in the memory hub comprises multiplying the base delay value by the delay adjustment value.

31. The method of claim 29 wherein the act of combining the base delay value with the delay adjustment value in the memory hub comprises adding the base delay value to the delay adjustment value.

32. The method of claim 29 wherein the refresh command comprises a self-refresh command.

33. The method of claim 29 wherein the refresh command comprises a auto-refresh command.

* * * * *